(12) United States Patent
Liu et al.

(10) Patent No.: US 11,802,198 B2
(45) Date of Patent: Oct. 31, 2023

(54) FLUORORESIN COMPOSITION, AND RESIN SHEET, LAMINATE AND PRINTED CIRCUIT BOARD

(71) Applicant: TAIWAN UNION TECHNOLOGY CORPORATION, Chupei (TW)

(72) Inventors: Shur-Fen Liu, Chupei (TW); Shi-Ing Huang, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 497 days.

(21) Appl. No.: 17/078,615

(22) Filed: Oct. 23, 2020

(65) Prior Publication Data

US 2021/0380792 A1 Dec. 9, 2021

(30) Foreign Application Priority Data

Jun. 3, 2020 (TW) ................. 109118699

(51) Int. Cl.

| | | |
|---|---|---|
| C08L 27/18 | (2006.01) | |
| C08L 27/14 | (2006.01) | |
| C08L 27/16 | (2006.01) | |
| B32B 27/30 | (2006.01) | |
| B32B 15/082 | (2006.01) | |
| C08K 7/14 | (2006.01) | |
| C08K 3/40 | (2006.01) | |
| C08K 3/016 | (2018.01) | |
| C08J 5/24 | (2006.01) | |
| C08J 5/18 | (2006.01) | |
| H05K 1/03 | (2006.01) | |
| H05K 1/05 | (2006.01) | |

(52) U.S. Cl.
CPC ............ *C08L 27/18* (2013.01); *B32B 15/082* (2013.01); *B32B 27/304* (2013.01); *C08J 5/18* (2013.01); *C08J 5/244* (2021.05); *C08K 3/016* (2018.01); *C08K 3/40* (2013.01); *C08K 7/14* (2013.01); *C08L 27/14* (2013.01); *C08L 27/16* (2013.01); *H05K 1/0366* (2013.01); *H05K 1/056* (2013.01); *B32B 2327/18* (2013.01); *B32B 2457/08* (2013.01); *C08J 2327/06* (2013.01); *C08J 2327/14* (2013.01); *C08J 2327/18* (2013.01); *C08K 2201/005* (2013.01)

(58) Field of Classification Search
CPC .......... C08L 27/18; C08L 27/14; C08L 27/16; B32B 2457/08; B32B 27/304; B32B 15/082; B32B 2327/18; C08K 3/40; C08K 3/016; C08K 2201/005; C08K 7/14; C08J 5/24; C08J 5/18; C08J 2327/14; C08J 2327/16; C08J 2327/18
See application file for complete search history.

(56) References Cited

U.S. PATENT DOCUMENTS 3,391,099 A 7/1968 Punderson

OTHER PUBLICATIONS

Yuan et al., Effects of Content of Chopped Glass Fibers on the Properties of Silica Filled PTFE Composites, Journal of Materials Science and Chemical Engineering, 2017, vol. 5, pp. 36-44. (Year: 2017).*
Effects of Content of Chopped Glass Fibers on the Properties of Silica Filled PTFE Composites; Yuan et al.; Journal of Materials Science and Chemical Engineering, May 2017, 36-44.

* cited by examiner

*Primary Examiner* — Robert D Harlan
(74) *Attorney, Agent, or Firm* — Dunlap Bennett & Ludwig, PLLC; Anna L. Kinney

(57) ABSTRACT

A fluororesin composition is provided. The fluororesin composition comprises the following constituents:
(A) a first fluororesin, which is polytetrafluoroethylene (PTFE) resin;
(B) a first filler, which is a flat glass fiber; and
(C) particles of a second fluororesin, which are coated with polysiloxane,
wherein, the particle size of the polysiloxane-coated particles of second fluororesin ranges from 0.2 μm to 80 μm, and the melting point of the second fluororesin is lower than the melting point of the first fluororesin.

18 Claims, No Drawings

FLUORORESIN COMPOSITION, AND RESIN SHEET, LAMINATE AND PRINTED CIRCUIT BOARD

CLAIM FOR PRIORITY

This application claims the benefit of Taiwan Patent Application No. 109118699 filed on Jun. 3, 2020, the subject matters of which are incorporated herein in their entirety by reference.

BACKGROUND OF THE INVENTION

Field of the Invention

The present invention provides a fluororesin composition, in particular, it is a fluororesin composition that comprises flat glass fibers and polysiloxane-coated particles of fluororesin. The present invention also provides a resin sheet, metal-clad laminate and printed circuit board provided by using the fluororesin composition.

Descriptions of the Related Art

With the development of 5th generation mobile telecommunications, there is an increasing demand for wireless communications and millimeter-wave transmissions, regarding this demand the printed circuit board industry has been urgently expecting a breakthrough. Epoxy resin is the most common resin material used in the printed circuit board industry. However, a printed circuit board prepared using epoxy resin is not as good as one prepared using fluorine-based resin in terms of dielectric constant, dielectric loss, and water absorption. In addition, when the transmission frequency of signals exceeds 60 GHz, only the printed circuit board prepared using fluorine-based resin can provide good stability and low signal loss.

However, the fluorine-based resin has a high coefficient of thermal expansion, resulting in warpage of the resin sheet prepared using fluorine-based resin when being laminated with a metal conductor. To solve this problem, the fluorine-based resin are usually added with a lot of inorganic fillers or glass fibers as reinforcing material to increase the rigidity and dimensional stability of the resin sheet. However, the fluorine-based resin with a high content of inorganic fillers usually has other problems. For example, as mentioned in the article of Journal of Materials Science and Chemical Engineering, 2017, 5, p. 36-44, a substrate prepared using polytetrafluoroethylene (PTFE) resin is provided with good dielectric properties but has unsatisfactory dimensional stability. In that article, fillers and glass fibers are added into the resin composition to resolve the aforementioned problem, but the resin sheet prepared thereby has poor adhesiveness with a metal foil (i.e., poor peeling strength of laminate).

Even conventional electronic material prepared using fluorine-based resin may have excellent dielectric properties, yet, it cannot have satisfactory dimensional stability and adhesiveness at the same time. There is still a need for an electronic material having excellent dielectric properties, dimensional stability, and adhesiveness simultaneously.

SUMMARY OF THE INVENTION

The present invention provides a fluororesin composition as well as a resin sheet, metal-clad laminate and printed circuit board prepared by using the fluororesin composition. The problem, the present invention aims to solve is that currently the electronic material prepared from conventional fluorine-based resins does not simultaneously have good dimensional stability and adhesiveness. The technical means of the present invention is to use a flat glass fiber and polysiloxane-coated particles of fluororesin in a fluororesin composition. The electronic material prepared from the fluororesin composition of the present invention is provided with excellent simultaneous dielectric properties, dimensional stability and adhesiveness, thereby especially suitable for applications in extremely high frequency (EHF) field. Thus, the present invention involves the following inventive objectives.

An objective of the present invention is to provide a fluororesin composition, which comprises the following components:
(A) a first fluororesin, which is polytetrafluoroethylene (PTFE) resin;
(B) a first filler, which is a flat glass fiber; and
(C) particles of a second fluororesin, which are coated with polysiloxane,
wherein, the particle size of the polysiloxane-coated particles of second fluororesin ranges from 0.2 μm to 80 μm, and the melting point of the second fluororesin is lower than the melting point of the first fluororesin.

In some embodiments of the present invention, based on the total number of atoms in the repeating unit of the second fluororesin, the content of fluorine atoms of the second fluororesin is at least 15%, and preferably from 25% to 90%.

In some embodiments of the present invention, the second fluororesin is selected from the group consisting of polychlorotrifluoroethylene (PCTFE), polyvinylidene difluoride (PVDF), polyvinyl fluoride (PVF), fluorinated ethylene propylene copolymer (FEP copolymer), polyfluoroalkoxy alkane (PFA), ethylene-tetrafluoroethylene copolymer (ETFE copolymer), ethylene-chloro trifluoroethylene copolymer (ECTFE copolymer), and combinations thereof.

In some embodiments of the present invention, the flat glass fiber has a non-circular cross section with an aspect ratio ranging from 1.5 to 10.0.

In some embodiments of the present invention, the fluororesin composition further comprises at least one of a second filler, a flame retardant, a dispersing agent, and a toughener, wherein the second filler is not a flat glass fiber.

Another objective of the present invention is to provide a resin sheet, which is prepared by impregnating a reinforcing material with the aforementioned fluororesin composition or by coating the aforementioned fluororesin composition onto a reinforcing material and drying the impregnated or coated reinforcing material.

In some embodiments of the present invention, the reinforcing material is a woven glass fiber cloth or a nonwoven glass fiber cloth.

In some embodiments of the present invention, the woven glass fiber cloth and the nonwoven glass fiber cloth are independently prepared from a glass fiber selected from the group consisting of E-glass fiber, NE-glass fiber, Q-glass fiber, D-glass fiber, S-glass fiber, T-glass fiber, L-glass fiber, and combinations thereof.

Yet another objective of the present invention is to provide a resin sheet, which is prepared by drying the aforementioned fluororesin composition into a sheet.

Still another objective of the present invention is to provide a metal-clad laminate, which is prepared by laminating the aforementioned resin sheet and a metal foil.

Still another objective of the present invention is to provide a printed circuit board, which is prepared from the aforementioned metal-clad laminate.

To render the above objectives, technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENTS

Hereinafter, some embodiments of the present invention will be described in detail. However, without departing from the spirit of the present invention, the present invention may be embodied in various embodiments and should not be limited to the embodiments described in the specification.

Unless it is additionally explained, the expressions "a," "the," or the like recited in the specification (especially in the claims) should include both the singular and the plural forms. Unless it is additionally explained, while describing the components in the solution, mixture and composition in the specification, the amount of each component is calculated based on the solid content, i.e., regardless of the weight of the solvent.

Unless it is additionally explained, the expressions "first", "second" or the like recited in the specification (especially in the claims) are merely used to distinguish the illustrated elements or constituents without special meanings. Those expressions do not intend to represent any priority.

As used herein, the term "content of fluorine atoms" refers to the number percentage of fluorine atoms in the repeating unit of a fluororesin based on the total number of all atoms in the repeating unit.

Compared to the prior art, the present invention features in that the fluororesin composition of the present invention uses polytetrafluoroethylene resin, flat glass fibers and polysiloxane-coated particles of second fluororesin in combination. By means of which, the electronic material prepared from the fluororesin composition of the present invention can achieve satisfactory dielectric properties as well as excellent dimensional stability and adhesiveness (peeling strength). The components and preparation method of the fluororesin composition of the present invention are described in detail in the following.

1. FLUORORESIN COMPOSITION

The fluororesin composition of the present invention comprises a first fluororesin (A), a first filler (B), and polysiloxane-coated particles (C) of second fluororesin as essential components, and other optional components.

1.1. (A) First Fluororesin

As used herein, fluororesin refers to a fluorocarbon-based polymer with multiple fluorine-carbon bonds. The fluororesin composition of the present invention comprises polytetrafluoroethylene (PTFE) resin as the first fluororesin (A). The content of fluorine atoms of polytetrafluoroethylene resin is 66.7% based on the total number of atoms in the repeating unit. The melting point of polytetrafluoroethylene resin is 327° C.

In terms of process convenience, during the preparation of the fluororesin composition of the present invention, polytetrafluoroethylene resin in a dispersion state (hereinafter also called "polytetrafluoroethylene resin dispersion") can be used. However, the present invention is not limited thereto, but can also use polytetrafluoroethylene resin in various states, such as polytetrafluoroethylene resin in a powder state. The preparation of polytetrafluoroethylene resin dispersion is not a key point of the present invention and thus will not be described in detail. Literature regarding the preparation of polytetrafluoroethylene resin dispersion can be found in, for example, U.S. Pat. No. 3,391,099 A, which is referenced herein in its entirety.

Polytetrafluoroethylene resin dispersions that are suitable for the present invention include many commercially available products, including but are not limited to products with a trade name of D210 available from Daikin (solid content: 60%, pH: 9 to 10), products with a trade name of Teflon™ PTFE DISP 30LX available from Dupont (solid content: 60%, pH: 10), products with a trade name of Algoflon D 3511F available from Solvay (solid content: 59%, pH: >9), products with a trade name of INOFLON® AD9300 available from Gujarat Fluorochemicals Limited (solid content: 60%, pH: >9.5), and products with a trade name of Dyneon™ TF5050Z available from 3M (solid content: 58%, pH: >9.5).

In the fluororesin composition of the present invention, based on the solid content of the fluororesin composition, the content of the first fluororesin (A) can be from 50 wt % to 90 wt %, such as 51 wt %, 52 wt %, 53 wt %, 54 wt %, 55 wt %, 56 wt %, 57 wt %, 58 wt %, 59 wt %, 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, or 89 wt %, or within a range between any two of the values described herein.

1.2. (B) First Filler

The fluororesin composition of the present invention comprises a flat glass fiber as the first filler (B). As used herein, a flat glass fiber refers to a glass fiber that has a non-circular cross section with an aspect ratio of larger than 1 (one). In general, the aspect ratio of the non-circular cross section can be calculated from a circumscribed rectangle obtained by observing the non-circular cross section via a scanning electron microscope (SEM), wherein the long side of the circumscribed rectangle is deemed as the long diameter of the non-circular cross section, and the short side of the circumscribed rectangle is deemed as the short diameter of the non-circular cross section. Examples of the cross section of the flat glass fiber include but are not limited to ellipse, egg-shape, cocoon-shape, capsule-shape, peanut-shape, calabash-shape, bean-shape, rectangle, kite-shape, and trapezoid.

In some embodiments of the present invention, the aspect ratio of the non-circular cross section of the flat glass fiber can be from 1.5 to 10.0, preferably from 2.0 to 6.0, such as 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, 5.0, 5.1, 5.2, 5.3, 5.4, 5.5, 5.6, 5.7, 5.8, or 5.9, or within a range between any two of the values described herein.

In terms of the dispersibility of the first filler (B) in the fluororesin composition, the flat glass fibers is preferably in chopped strand type, and the length of chopped strand can be, for example, from 10 μm to 15 mm, such as 25 μm, 50 μm, 75 μm, 100 μm, 150 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.5 mm, 2 mm, 2.5 mm, 3 mm, 3.5 mm, 4 mm, 4.5 mm, 5 mm, 5.5 mm, 6 mm, 6.5 mm, 7 mm, 7.5 mm, 8 mm, 8.5 mm, 9 mm, 9.5 mm, 10 mm, 10.5 mm, 11 mm, 11.5 mm, 12 mm, 12.5 mm, 13 mm, 13.5 mm, 14 mm, or 14.5 mm, or within a range between any two of the values described herein, but the present invention is not limited thereto.

The material of the flat glass fiber that is used as the first filler (B) is not particularly limited, and can be, for example, one or more selected from the group consisting of E-glass, T-glass, NE-glass, C-glass, S-glass, S2-glass, Q-glass, D-glass, L-glass, and R-glass.

Examples of the flat glass fiber that can be used as the first filler (B) include the following commercially available products: products with a trade name of CSG 3PA-830 available from Nittobo, and products with a trade name of ECS 3098 HF available from Chongqing Polycomp International Corporation.

In the fluororesin composition of the present invention, based on the solid content of the fluororesin composition, the content of the first filler (B) can be from 5 wt % to 20 wt %, such as 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, or 19 wt %, or within a range between any two of the values described herein.

1.3. (C) Polysiloxane-Coated Particles of Second Fluororesin 1.3.1. Feature of (C) Polysiloxane-Coated Particles of Second Fluororesin In the fluororesin composition of the present invention, the addition of a flat glass fiber improves the dimensional stability of the electronic material prepared from the fluororesin composition but also adversely affects the adhesiveness (peeling strength) of the electronic material. Thus, in addition to the flat glass fiber, the fluororesin composition of the present invention is further added with the polysiloxane-coated particles (C) of second fluororesin in order to significantly improve the adhesiveness between a resin sheet and a metal foil without affecting the dimensional stability and dielectric properties of the electronic material prepared from the fluororesin composition. The polysiloxane-coated particles of second fluororesin are particles with a core-shell structure, wherein the core structure is formed from the second fluororesin, and the shell structure is formed from polysiloxane. Without being restricted by any theories, it is believed that during the high temperature pressing of a resin sheet with a metal foil, polysiloxane-coated particles of second fluororesin tend to flow to the interface between the resin sheet and the metal foil, and a portion of the second fluororesin is pressed out of the shell structure. The particles together with the pressed-out second fluororesin portion then generate a synergistic effect on improving the adhesiveness between the resin sheet and the metal foil.

The particle size of the polysiloxane-coated particles (C) of second fluororesin is from 0.2 μm to 80 μm, such as 0.3 μm, 0.4 μm, 0.5 μm, 0.6 μm, 0.7 μm, 0.8 μm, 0.9 μm, 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, or 79 μm, or within a range between any two of the values described herein. Polysiloxane-coated particles of second fluororesin (C) with a particle size smaller than the aforementioned range are difficult to prepare. Polysiloxane-coated particles (C) of second fluororesin with a particle size larger than the afore-mentioned range will deteriorate the dimensional stability of thus prepared electronic material.

In the fluororesin composition of the present invention, the second fluororesin is different from the first fluororesin. That is, the second fluororesin is not polytetrafluoroethylene resin. Furthermore, the melting point of the second fluororesin is lower than the melting point of the first fluororesin. In a preferred embodiment of the present invention, based on the total number of atoms in the repeating unit of the second fluororesin, the content of fluorine atoms of the second fluororesin is preferably at least 15%, more preferably from 25% to 90%, such as 30%, 33.3%, 35%, 40%, 41.7%, 45%, 50%, 55%, 58.3%, 60%, 65%, 66.7%, 70%, 75%, 80%, 83.3%, or 85%, or within a range between any two of the values described herein.

In some embodiments of the present invention, the second fluororesin can be a polymer or copolymer obtained by polymerizing a monomer selected from the group consisting of a monomer of the following formula (I), a monomer of the following formula (II), and combinations thereof. Alternatively, the second fluororesin can be a copolymer obtained by copolymerizing the monomer of the following formula (I) with other ethylenic monomer or a copolymer obtained by copolymerizing the monomer of the following formula (II) with other ethylenic monomer. Examples of the afore-mentioned ethylenic monomer include but are not limited to ethylene and propylene.

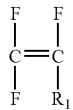

[Formula (I)]

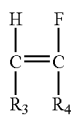

[Formula (II)]

In formula (I), $R_1$ represents F, Cl, $R_2$, or —$OR_2$, wherein $R_2$ represents a $C_1$ to $C_9$ perfluorinated alkyl with or without an ether bond. In formula (II), $R_3$ represents H or F, $R_4$ represents H, F, Cl, $R_5$, or —$OR_5$, wherein $R_5$ represents a $C_1$ to $C_9$ perfluorinated alkyl with or without an ether bond. Specific examples of the $C_1$ to $C_9$ perfluorinated alkyl include but are not limited to trifluoromethyl, pentafluoroethyl, heptafluoro-n-propyl, heptafluoroisopropyl, nonafluoro-n-butyl, nonafluoroisobutyl, nonafluoro-sec-butyl, nonafluoro-tert-butyl, undecafluoro-n-pentyl, undecafluoroisopentyl, and undecafluoro-neo-pentyl.

Specific examples of the second fluororesin include but are not limited to polychlorotrifluoroethylene (content of fluorine atoms: 50%, melting point: 220° C.), polyvinylidene difluoride (content of fluorine atoms: 33.3%, melting point: 165° C.), polyvinyl fluoride (content of fluorine atoms: 16.7%, melting point: 203° C.), fluorinated ethylene propylene copolymer (content of fluorine atoms: 66.7%, melting point: 260° C.), polyfluoroalkoxy alkane (content of fluorine atoms: 66.7%, melting point: 310° C.), ethylene-tetrafluoroethylene copolymer (content of fluorine atoms: 33.3%, melting point: 270° C.), and ethylene-chloro trifluoroethylene copolymer (content of fluorine atoms: 25%, melting point: 245° C.). The above-mentioned fluororesin can either be used alone or in any combination to serve as the second fluororesin. In the appended examples, the second fluororesin is polyfluoroalkoxy alkane, fluorinated ethylene propylene copolymer, ethylene-tetrafluoroethylene copolymer, or ethylene-chloro trifluoroethylene copolymer.

In the fluororesin composition of the present invention, based on the solid content of the fluororesin composition, the content of the polysiloxane-coated particles (C) of second fluororesin can be from 1 wt % to 20 wt %, such as 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, or 19 wt %, or within a range between any two of the values described herein.

1.3.2. Preparation of (C) Polysiloxane-Coated Particles of Second Fluororesin

The polysiloxane-coated particles (C) of second fluororesin can be prepared in the following manner: mixing the second fluororesin with a solvent and a catalyst to obtain an alkaline solution of the second fluororesin, and further adding alkoxysilane in the alkaline solution of the second fluororesin to form polysiloxane and then coat the second fluororesin. In general, the above-mentioned manner can include the following steps: (1) mixing the second fluororesin, a solvent, a catalyst and an optional surfactant to obtain an alkaline solution of the second fluororesin; (2) adding a hydrolytic condensable alkoxysilane into the alkaline solution of the second fluororesin; and (3) allowing the alkoxysilane to conduct a condensation polymerization reaction and thus coat the second fluororesin by means of a sol-gel method to obtain polysiloxane-coated particles of the second fluororesin. The specific preparation is illustrated in the Examples and a general description is provided below.

The source of the second fluororesin in step (1) is not particularly limited and can be a powder or dispersion of conventional fluororesin that satisfies the aforementioned definition. For example, the source of the second fluororesin in step (1) includes the following commercially available products: dispersions of polyfluoroalkoxy alkane, including products with a trade name of Teflon™ PFAD 335D available from Chemours (solid content: 60%, average particle size: 0.2 μm, pH: 10), products with a trade name of Dyneon PFA 6910GZ available from 3M (solid content: 50%, average particle size: 0.09 μm, pH: 9), and products with a trade name of INOFLON® PFA 8910 available from Gujarat Fluorochemicals Limited (solid content: 60%, average particle size: 0.17 μm, pH: >9.5); dispersions of fluorinated ethylene propylene copolymer, including products with a trade name of Dyneon FEP 6300GZ available from 3M (solid content: 55%, average particle size: 0.15 μm, pH: >9), products with a trade name of Teflon™ FEPD 121 available from Chemours (solid content: 55%, average particle size: 0.18 μm, pH: 10), and products with a trade name of INOFLON® FEP 4910 available from Gujarat Fluorochemicals Limited (solid content: 55%, average particle size: 0.17 μm, pH: >9.5); dispersions of ethylene-tetrafluoroethylene copolymer, including products with a trade name of Dyneon ET 6425 available from 3M (solid content: 20%, average particle size: 0.07 μm, pH: 7); and powders of ethylene-chloro trifluoroethylene copolymer, including products with a trade name of Halar 6014 available from Solvay (average particle size: 80 μm).

Examples of the solvent in step (1) include but are not limited to water, methanol, ethanol, isopropanol, and acetone. The above-mentioned solvents can either be used alone or in any combination. In the appended examples, a mixture of water and ethanol is used as the solvent. Examples of the catalyst in step (1) include but are not limited to alkaline compounds. Examples of the above-mentioned alkaline compounds include but are not limited to ammonia water, sodium hydroxide, potassium hydroxide, potassium carbonate, and sodium carbonate. The above-mentioned alkaline compounds can either be used alone or in any combination. Examples of the surfactant in step (1) include but are not limited to dodecyltrimethylammonium bromide, dodecyltrimethylammonium chloride, hexadecyltrimethylammonium bromide, octadecyltrimethylammonium chloride, dodecyl dimethyl benzyl ammonium bromide, and alkylphenol polyoxyethylene ether. The above-mentioned surfactants can either be used alone or in any combination. Examples of alkylphenol polyoxyethylene ether include but are not limited to octylphenol polyoxyethylene ether, nonylphenol polyoxyethylene ether, and dodecylphenol polyoxyethylene ether.

The pH value of the alkaline solution of second fluororesin can range from 9 to 13. In the appended examples, the alkaline solution of the second fluororesin is prepared using the second fluororesin, water, ethanol, ammonia water, and octylphenol polyoxyethylene ether, and the pH value of the obtained alkaline solution of the second fluororesin is 11.

The alkoxysilane in step (2) refers to an organosilicon compound with a Si—O bond, and examples thereof include but are not limited to methyl trimethoxy silane, ethyl trimethoxy silane, methyl triethoxy silane, ethyl triethoxy silane, trimethoxy silane, triethoxy silane, tetramethoxy silane, tetraethoxy silane, phenyl trimethoxy silane, phenyl triethoxy silane, vinyl trimethoxy silane, and 3-aminopropyl trimethoxy silane.

In some embodiments of the present invention, the weight ratio of the solid content of the second fluororesin to the content of alkoxysilane is from 1:5 to 4:1, such as 1:4.5, 1:4, 1:3.5, 1:3, 1:2.5, 1:2, 1:1.5, 1:1, 1.5:1, 2:1, 2.5:1, 3:1, or 3.5:1.

Step (3) is to form polysiloxane on the surface of the second fluororesin by means of a sol-gel method. As used herein, the sol-gel method is a wet chemistry reaction method, wherein a precursor (i.e., alkoxysilane in step (2)) is subjected to a hydrolysis reaction in an aqueous solution to form an intermediate product aqueous solution, the intermediate product aqueous solution is subjected to a condensation reaction to form an intermediate product aqueous solution containing uniformly dispersed fine colloidal particles (called "sol"), and then a part of the fine colloidal particles is polymerized and gelled to form a network-like colloid, thereby obtaining an aqueous solution containing a network-like colloid (called "gel"). The powders obtained by heating and drying the aqueous solution containing a network-like colloid are the polysiloxane-coated particles (C) of the second fluororesin. The above-mentioned precursor includes but is not limited to a compound having a hydrolyzable group bonded to a silicon atom, a hydrolyzate thereof, and a partial hydrolyzate-condensate product thereof. Examples of the hydrolyzable group include but are not limited to alkoxy, acyloxy, and hydrosilyl. Specific examples of the precursor include but are not limited to the aforementioned examples of alkoxysilane.

The sol-gel method in step (3) involves the following reactions:

Si—OR+HOH⇌Si—OH+ROH  [Reaction formula (1)]

Si—OH+Si—OH⇌Si—O—Si+HOH  [Reaction formula (2-1)]

Si—OR+Si—OH⇌Si—O—Si+ROH  [Reaction formula (2-2)]

In reaction formulas (1), (2-1) and (2-2), R represents a substituted or unsubstituted alkyl. In reaction formula (1), the forward reaction from left to right is a hydrolysis reaction. In reaction formula (2-1), the forward reaction from left to right is a dehydration condensation reaction. In reaction formula (2-2), the forward reaction from left to right is a dealcoholization condensation reaction. In the sol-gel method, the condensation reaction does not start after the completion of the hydrolysis reaction but right after the presence of Si—OH in the aqueous solution. Therefore, in most of the reaction time, the condensation reaction is carried out together with the hydrolysis reaction.

1.4. Optional Components

In addition to components (A) to (C), the fluororesin composition of the present invention can optionally comprise other components to adaptively improve the workability of the fluororesin composition during processing or improve the physicochemical properties of the electronic material prepared from the fluororesin composition. Examples of the optional component include but are not limited to a second filler, a flame retardant, a dispersing agent, and a toughener, wherein the second filler is not a flat glass fiber. The above-mentioned optional components can either be used alone or in any combination.

[Second Filler]

The fluororesin composition may further comprise a second filler to improve the mechanical strength, thermal conductivity and dimensional stability of the electronic material prepared therefrom. The second filler is different from the first filler; that is, the second filler is not a flat glass fiber. Examples of the second filler include but are not limited to silica (including hollow silica), aluminum oxide, aluminum hydroxide, magnesium oxide, magnesium hydroxide, calcium carbonate, talc, clays, aluminum nitride, boron nitride, silicon aluminum carbide, silicon carbide, sodium carbonate, titanium dioxide, zinc oxide, zirconium oxide, quartzes, diamond powders, diamond-like carbon powders, graphites, calcined kaolin, pryan, micas, hydrotalcite, carbon nanotubes, glass beads, hollow glass beads, ceramic whiskers, and nanosized inorganic powders. The above-mentioned second fillers can either be used alone or in any combination.

In general, based on the solid content of the fluororesin composition, the content of the second filler may range from 0 wt % to 40 wt %, but the present invention is not limited thereto. Persons having ordinary skill in the art can adjust the content of the second filler depending on their needs.

[Flame Retardant]

In general, adding a flame retardant in the fluororesin composition can improve the flame retardance of the electronic material prepared from the fluororesin composition. The types of the flame retardant include but are not limited to a phosphorus-containing flame retardant, a bromine-containing flame retardant, and a nitrogen-containing compound, and these flame retardants can either be used alone or in any combination. Examples of the phosphorus-containing flame retardant include but are not limited to phosphate esters, phosphazenes, ammonium polyphosphates, metal phosphinates, melamine phosphates, and combinations thereof. Examples of the bromine-containing flame retardant include but are not limited to tetrabromobisphenol A, decabromodiphenyloxide, decabrominated diphenyl ethane, 1,2-bis(tribromophenyl) ethane, brominated epoxy oligomer, octabromotrimethylphenyl indane, bis(2,3-dibromopropyl ether), tris(tribromophenyl) triazine, brominated aliphatic hydrocarbon, and brominated aromatic hydrocarbon. Examples of the nitrogen-containing compound include but are not limited to melamine and derivatives thereof.

In general, based on the solid content of the fluororesin composition, the content of the flame retardant may range from 0 wt % to 30 wt %, but the present invention is not limited thereto. Persons having ordinary skill in the art can adjust the content of the flame retardant depending on their needs.

1.5. Preparation of Fluororesin Composition

The fluororesin composition of the present invention may be prepared into a slurry or colloidal group for subsequent processing by uniformly mixing the components of the fluororesin composition, including the first fluororesin (A), the first filler (B), the polysiloxane-coated particles (C) of second fluororesin and other optional components, with a stirrer, and dissolving or dispersing the resultant mixture in a solvent. The solvent can be any inert solvent that can dissolve or disperse the components of the fluororesin composition but does not react with the components of the fluororesin composition. For example, solvents that can dissolve or disperse the components of the fluororesin composition include but are not limited to water, ethanol, isopropanol, and acetone. Each of the mentioned solvents can be used either alone or in any combination. The content of the solvent in the fluororesin composition is not particularly limited as long as the components of the fluororesin composition can be evenly dissolved or dispersed therein. In the appended examples, toluene is used as the solvent.

Alternatively, when the first fluororesin (A) is in a dispersion type and the content of the solvent in the dispersion is sufficient, the slurry or colloidal group can be prepared by uniformly mixing the components of the fluororesin composition via a stirrer without additionally using a solvent.

2. RESIN SHEET

The present invention also provides a resin sheet prepared from the aforementioned fluororesin composition. In some embodiments of the present invention, the resin sheet is prepared by impregnating a reinforcing material with the aforementioned fluororesin composition or by coating the aforementioned fluororesin composition onto a reinforcing material and drying the impregnated or coated reinforcing material. The preparing method of a resin sheet is not particularly limited and can be easily accomplished by persons having ordinary skill in the art based on the disclosure of the subject specification and their general knowledge. Specifically, the methods for impregnating or coating the fluororesin include but are not limited to dipping, roller coating, die coating, bar coating, and spraying. The impregnated or coated reinforcing material can be dried under a temperature ranging from 200° C. to 600° C. for 1 (one) minute to 30 minutes, thereby obtaining a resin sheet.

Reinforcing materials include but are not limited to papers, cloths or mats made from materials selected from the group consisting of paper fibers, glass fibers, quartz fibers, organic polymeric fibers, carbon fibers, and combinations thereof. Examples of the organic polymeric fibers include but are not limited to a high-modulus polypropylene (HMPP) fiber, a polyamide fiber, an ultra-high molecular weight polyethylene (UHMWPE) fiber, and a liquid crystal polymer (LCP). In some embodiments of the present invention, the reinforcing material is a woven glass fiber cloth or a nonwoven glass fiber cloth. The woven glass fiber cloth and the nonwoven glass fiber cloth each can be prepared from a glass fiber selected from the group consisting of E-glass fiber, NE-glass fiber, Q-glass fiber, D-glass fiber, S-glass fiber, T-glass fiber, L-glass fiber, and combinations thereof.

Alternatively, the resin sheet of the present invention can be prepared by drying the aforementioned fluororesin composition into a sheet. First, the slurry or colloidal group of the fluororesin composition is formed into a sheet object by means of the following methods: roller forming, coating, die casting, or melt extrusion and roller forming. Next, the sheet object is dried under a temperature ranging from 90° C. to 170° C. for 1 (one) hour to 5 hours to remove solvent. Afterwards, the dried sheet object is calendered under a temperature ranging from 90° C. to 150° C. to form a sheet, and then sintered under a temperature ranging from 300° C. to 400° C. for 20 minutes to 60 minutes to obtain a resin sheet.

Alternatively, the resin sheet of the present invention can be formed as follows. First, the slurry or colloidal group of the fluororesin composition is dried under a temperature ranging from 80° C. to 120° C. for 1 (one) hour to 5 hours to remove the solvent. Next, the dried slurry or colloidal group is subjected to the following process to provide a sheet object: roller forming, die casting, or melt extrusion and roller forming. Then the sheet object is dried under a temperature ranging from 150° C. to 300° C. for 120 minutes to 240 minutes to obtain a resin sheet.

3. METAL-CLAD LAMINATE AND PRINTED CIRCUIT BOARD

The present invention also provides a metal-clad laminate prepared from the abovementioned resin sheet, which comprises a dielectric layer and a metal layer and can be prepared by laminating the aforementioned resin sheet and a metal foil, wherein the dielectric layer is provided by the aforementioned resin sheet. Specifically, the metal-clad laminate of the present invention can be prepared by superimposing a plurality of the abovementioned resin sheets, superimposing a metal foil (such as a copper foil) on at least one external surface of the dielectric layer composed of the superimposed resin sheets to provide a superimposed object comprising the dielectric layer and metal layer, and then performing a hot-pressing operation onto the superimposed object to obtain the metal-clad laminate. The hot-pressing operation conditions are as follows: hot-pressing for 80 to 250 minutes under a pressure ranging from 200 psi (pound per square inch) to 550 psi at a temperature ranging from 250° C. to 450° C.

Furthermore, the metal-clad laminate can form a printed circuit board by further patterning the external metal foil thereof. The method for patterning includes but is not limited to etching.

4. EXAMPLES

4.1. Test Methods

The present invention is further illustrated by the embodiments hereinafter, wherein the testing instruments and methods are as follows:

[Peeling Strength Test]
The peeling strength refers to the bonding strength between the metal foil and hot-pressed laminated resin sheet and is expressed as the force required to vertically peel clad copper foil with a width of ⅛ inch from the surface of the hot-pressed laminated resin sheet. The unit of the peeling strength is pound per inch (lb/in).

[Dielectric Constant (Dk) and Dissipation Factor (Df) Measurement] The dielectric constant (Dk) and dissipation factor (Df) of the resin sheet are measured according to IPC-TM-6502.5.5.13 under an operating frequency of 10 GHz.

[Coefficient of Thermal Expansion in Z-Axis Test]
The coefficient of thermal expansion in Z-axis of the resin sheet is tested using a Thermomechanical Analyzer (model name: TMA Q-400, available from TA Instruments) according to ASTM D3386. The test conditions are as follows: the atmosphere is nitrogen, the heating rate is 10° C./minute, and the test temperature ranges from 40° C. to 300° C. The unit of coefficient of thermal expansion in Z-axis is ppm/° C.

4.2. Preparation of Polysiloxane-Coated Particles of Second Fluororesin

Synthesis Example 1

100 g of pure water, 20 g of ethanol (available from TRANS CHIEF CHEMICAL), 18 g of 28% ammonia water (available from ECHO CHEMICAL), 1 (one) g of surfactant (trade name: OP-10, available from Jilin Petrochemical) and 60 g of PFA dispersion (trade name: Teflon™ PFAD 335D, pH: 10, average particle size: 0.2 μm, solid content: 60%, available from Chemours) were evenly mixed to obtain an alkaline solution of the second fluororesin with a pH value of 11. Then, the alkaline solution of the second fluororesin (based on solid content) and phenyl trimethoxysilane (PTMS, available from Dow Corporate) were mixed at a weight ratio of 4:1 to obtain a mixture; and the mixture was stirred at 45° C. for 2 hours to obtain a gel-like colloidal solution. The colloidal solution was then baked at 80° C. for 4 hours to obtain polysiloxane-coated particles of the second fluororesin in white powders with an average particle size of 0.2 μm.

Synthesis Example 2

100 g of pure water, 20 g of ethanol, 18 g of 28% ammonia water, 1 (one) g of surfactant OP-10 and 60 g of PFA dispersion Teflon™ PFAD 335D were evenly mixed to obtain an alkaline solution of the second fluororesin with a pH value of 11. Then, the alkaline solution of the second fluororesin (based on solid content) and PTMS were mixed at a weight ratio of 2:1 to obtain a mixture; and the mixture was stirred at 45° C. for 2 hours to obtain a gel-like colloidal solution. The colloidal solution was then baked at 80° C. for 4 hours to obtain polysiloxane-coated particles of the second fluororesin in white powders with an average particle size of 2 μm.

Synthesis Example 3

100 g of pure water, 20 g of ethanol, 18 g of 28% ammonia water, 1 (one) g of surfactant OP-10 and 60 g of PFA dispersion Teflon™ PFAD 335D were evenly mixed to obtain an alkaline solution of the second fluororesin with a pH value of 11. Then, the alkaline solution of the second fluororesin (based on solid content) and PTMS were mixed at a weight ratio of 1:2 to obtain a mixture; and the mixture was stirred at 45° C. for 2 hours to obtain a gel-like colloidal solution. The colloidal solution was then baked at 80° C. for 4 hours to obtain polysiloxane-coated particles of the second fluororesin in white powders with an average particle size of 20 μm.

Synthesis Example 4

100 g of pure water, 20 g of ethanol, 18 g of 28% ammonia water, 1 (one) g of surfactant OP-10 and 60 g of PFA dispersion Teflon™ PFAD 335D were evenly mixed to obtain an alkaline solution of the second fluororesin with a pH value of 11. Then, the alkaline solution of the second fluororesin (based on solid content) and PTMS were mixed at a weight ratio of 1:5 to obtain a mixture; and the mixture was stirred at 45° C. for 2 hours to obtain a gel-like colloidal solution. The colloidal solution was the baked at 80° C. for 4 hours to obtain polysiloxane-coated particles of the second fluororesin in white powders with an average particle size of 100 μm.

Synthesis Example 5

100 g of pure water, 20 g of ethanol, 18 g of 28% ammonia water, 1 (one) g of surfactant OP-10 and 60 g of FEP dispersion (trade name: Teflon™ FEPD 121, pH: 10, average particle size: 0.18 μm, solid content: 55%, available from Chemours) were evenly mixed to obtain an alkaline solution of the second fluororesin with a pH value of 11. Then, the alkaline solution of the second fluororesin (based on solid content) and PTMS were mixed at a weight ratio of 4:1 to obtain a mixture; and the mixture was stirred at 45° C. for 2 hours to obtain a gel-like colloidal solution. The colloidal solution was then baked at 80° C. for 4 hours to obtain polysiloxane-coated particles of the second fluororesin in white powders with an average particle size of 0.2 μm.

Synthesis Example 6

100 g of pure water, 20 g of ethanol, 20 g of 28% ammonia water, 1 (one) g of surfactant OP-10 and 60 g of ETFE dispersion (trade name: Dyneon ET 6425, pH: 7, average particle size: 0.07 μm, solid content: 20%, available from 3M) were evenly mixed to obtain an alkaline solution of the second fluororesin with a pH value of 11. Then, the alkaline solution of the second fluororesin (based on solid content) and PTMS were mixed at a weight ratio of 4:1 to obtain a mixture; and the mixture was stirred at 45° C. for 2 hours to obtain a gel-like colloidal solution. The colloidal solution was then baked at 80° C. for 4 hours to obtain polysiloxane-coated particles of the second fluororesin in white powders with an average particle size of 0.2 μm.

Synthesis Example 7

140 g of pure water, 20 g of ethanol, 20 g of 28% ammonia water, 1 (one) g of surfactant OP-10 and 100 g of ECTFE powders (trade name: Halar 6014, average particle size: 80 μm, available from Solvay) were mixed and stirred for 30 minutes to obtain an alkaline solution of the second fluororesin with a pH value of 11. Then, the alkaline solution of the second fluororesin (based on solid content) and PTMS were mixed at a weight ratio of 4:1 to obtain a mixture; and the mixture was stirred at 45° C. for 2 hours to obtain a gel-like colloidal solution. The colloidal solution was then baked at 80° C. for 4 hours to obtain polysiloxane-coated particles of the second fluororesin in white powders with an average particle size of 80 μm.

4.3. Preparation of Fluororesin Composition

The fluororesin compositions of Examples 1 to 6 and Comparative Examples 1 to 7 were prepared according to the proportions shown in Tables 1-1 and 1-2. Specifically, each of the fluororesin compositions was prepared by mixing the components at room temperature, and stirring the resultant mixture at room temperature for 40 minutes to 60 minutes to obtain the colloidal group of each of the fluororesin compositions. Detailed descriptions for the components are as follows. The first fluororesin (A) was a PTFE dispersion with a trade name of D210 available from Daikin (solid content: 60%, pH: 9 to 10), the first filler (B) was glass fiber chopped strands with a modified cross section with the trade name CSG 3PA-830 available from Nittobo, the PFA resin was a PFA dispersion with the trade name Teflon™ PFAD 335D, the spherical filler was a product with the trade name SC 6500 available from ADMATECHS, and a silane compound was PTMS.

TABLE 1-1

Composition of the fluororesin compositions of Examples 1 to 6

| Unit: parts by weight | | Example | | | | | |
|---|---|---|---|---|---|---|---|
| | | 1 | 2 | 3 | 4 | 5 | 6 |
| (A) First fluororesin | D210 | 85 | 85 | 85 | 85 | 85 | 85 |
| (B) First filler | CSG 3PA-830 | 10 | 10 | 10 | 10 | 10 | 10 |
| (C) Polysiloxane-coated particles of second fluororesin | | 5 Synthesis Example 1 | 5 Synthesis Example 5 | 5 Synthesis Example 6 | 5 Synthesis Example 7 | 5 Synthesis Example 2 | 5 Synthesis Example 3 |

TABLE 1-2

Composition of the fluororesin compositions of Comparative Examples 1 to 7

| Unit: parts by weight | | Comparative Example | | | | | | |
|---|---|---|---|---|---|---|---|---|
| | | 1 | 2 | 3 | 4 | 5 | 6 | 7 |
| (A) First fluororesin | D210 | 100 | 85 | 85 | 85 | 85 | 85 | 85 |
| (B) First filler | CSG 3PA-830 | | 15 | | 10 | 10 | 10 | 10 |

TABLE 1-2-continued

Composition of the fluororesin compositions of Comparative Examples 1 to 7

| Unit: parts by weight | | Comparative Example | | | | | | |
|---|---|---|---|---|---|---|---|---|
| | | 1 | 2 | 3 | 4 | 5 | 6 | 7 |
| (C) Polysiloxane-coated particles of second fluororesin | | | | 15 Synthesis Example 1 | | | 5 Synthesis Example 4 | |
| PFA resin | PFAD 335D | | | | 5 | | | |
| Spherical filler | SC 6500 | | | | | 5 | | |
| Silane compound | PTMS | | | | | | | 5 |

4.4. Preparation and Property Measurements of Resin Sheet and Laminates

The colloidal groups of Examples 1 to 6 and Comparative Examples 1 to 7 were dried at 80° C. to 120° C. for 2 hours and then subjected to rolling to obtain a sheet object (thickness: 125 μm), respectively. Next, the sheet object was put into an oven and dried at 150° C. to 300° C. for 3 hours to obtain a resin sheet. Afterwards, two sheets of resin sheet were superimposed, and two sheets of copper foils (high temperature elongation (HTE) copper foil, each 0.5 oz.) were respectively superimposed on both of the two external surfaces of the superimposed resin sheets, and then the prepared objects were placed in a hot press machine to be cured through a high temperature hot-pressing. The hot-pressing conditions were as follows: heating to 310° C. to 320° C. at a heating rate of 5.0° C./min, followed by heating to 370° C. to 380° C. at a heating rate of 2.7° C./min, and lastly by hot-pressing at 370° C. to 380° C. for 150 minutes under a full pressure ranging from 250 psi to 500 psi. Each of the metal-clad laminates of Examples 1 to 6 and Comparative Examples 1 to 7 were thereby prepared.

The properties of the resin sheets and metal-clad laminates of Examples 1 to 6 and Comparative Examples 1 to 7, including peeling strength, coefficient of thermal expansion in Z-axis, Dk and Df, were evaluated according to the aforementioned test methods, and the results are listed in Table 2.

TABLE 2

Properties of resin sheets and metal-clad laminates of Examples 1 to 6 and Comparative Examples 1 to 7

| Unit | | Peeling strength pound/inch | Coefficient of thermal expansion in Z-axis ppm/° C. | Dk @ 10 GHz | Df @ 10 GHz |
|---|---|---|---|---|---|
| Example | 1 | 26.18 | 75.1 | 2.219 | 0.0008 |
| | 2 | 26.27 | 74.8 | 2.209 | 0.0009 |
| | 3 | 19.28 | 96.5 | 2.452 | 0.0012 |
| | 4 | 18.72 | 103.9 | 3.522 | 0.0024 |
| | 5 | 22.28 | 78.6 | 2.208 | 0.0008 |
| | 6 | 18.85 | 80.7 | 2.195 | 0.0008 |
| Comparative Example | 1 | 15.85 | 135.7 | 2.135 | 0.0002 |
| | 2 | 3.32 | 57.8 | 2.292 | 0.0012 |
| | 3 | 30.59 | 147.5 | 2.151 | 0.0006 |
| | 4 | 11.11 | 83.6 | 2.208 | 0.0008 |
| | 5 | 10.84 | 63.2 | 2.229 | 0.0009 |
| | 6 | 11.25 | 83.9 | 2.219 | 0.0009 |
| | 7 | 9.83 | 86.8 | 2.246 | 0.0011 |

As shown in Table 2, each of the electronic materials prepared from the fluororesin composition of the present invention is provided with satisfactory dielectric properties (e.g., Dk, Df). Particularly, each of the electronic materials prepared from the fluororesin composition of the present invention simultaneously has good peeling strength (at least 18.72 pounds/inch) and good dimensional stability (i.e., a lower coefficient of thermal expansion in Z-axis). In addition, Examples 1, 5, and 6 show that the smaller the particle size of the polysiloxane-coated particles (C) of second fluororesin, the better the peeling strength and dimensional stability of the electronic materials. Furthermore, examples 1 to 4 show that the higher the content of fluorine atoms of the second fluororesin, the better the peeling strength and dimensional stability of the electronic materials.

By contrast, as shown in Table 2, the electronic materials prepared by using fluororesin compositions other than the fluororesin composition of the present invention do not simultaneously have good peeling strength and good dimensional stability. That is, the resultant electronic materials do not obtain a balance between peeling strength and dimensional stability. Specifically, comparative examples 1 to 3 show that, when the fluororesin composition does not comprise the first fluororesin (A), the first filler (B) and the polysiloxane-coated particles (C) of the second fluororesin simultaneously, the resultant electronic material do not simultaneously have good peeling strength and good dimensional stability. Comparative Examples 4, 5, and 7 show that, when the fluororesin composition comprises only the first filler (B) but not the polysiloxane-coated particles (C) of the second fluororesin, the resultant electronic material may have good dimensional stability but do not have good peeling strength. In addition, comparative example 6 shows that, when the particle size of the polysiloxane-coated particles (C) of the second fluororesin is larger than the designated range, the peeling strength of the resultant electronic material unexpectedly deteriorates. The above experimental results fully demonstrate that, the fluororesin composition of the present invention certainly provide unexpected efficacy by means of combining the specific components.

The above examples are used to illustrate the principle and efficacy of the present invention and show the inventive features thereof but are not used to limit the scope of the present invention. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A fluororesin composition, which comprises:
   (A) a first fluororesin, which is polytetrafluoroethylene (PTFE) resin;
   (B) a first filler, which is a flat glass fiber; and (C) particles of a second fluororesin, which are coated with polysiloxane, wherein, the particle size of the polysiloxane-coated particles of second fluororesin ranges from 0.2 μm to 80 μm, and the melting point of the second fluororesin is lower than the melting point of the first fluororesin.

2. The fluororesin composition of claim 1, wherein based on the total number of atoms in the repeating unit of the second fluororesin, the content of fluorine atoms of the second fluororesin is at least 15%.

3. The fluororesin composition of claim 1, wherein based on the total number of atoms in the repeating unit of the second fluororesin, the content of fluorine atoms of the second fluororesin ranges from 25% to 90%.

4. The fluororesin composition of claim 1, wherein the second fluororesin is selected from the group consisting of polychlorotrifluoroethylene (PCTFE), polyvinylidene difluoride (PVDF), polyvinyl fluoride (PVF), fluorinated ethylene propylene copolymer (FEP copolymer), polyfluoroalkoxy alkane (PFA), ethylene-tetrafluoroethylene copolymer (ETFE copolymer), ethylene-chloro trifluoroethylene copolymer (ECTFE copolymer), and combinations thereof.

5. The fluororesin composition of claim 1, wherein the flat glass fiber has a non-circular cross section with an aspect ratio ranging from 1.5 to 10.0.

6. The fluororesin composition of claim 1, further comprising at least one of a second filler, a flame retardant, a dispersing agent, and a toughener, wherein the second filler is not a flat glass fiber.

7. The fluororesin composition of claim 2, further comprising at least one of a second filler, a flame retardant, a dispersing agent, and a toughener, wherein the second filler is not a flat glass fiber.

8. The fluororesin composition of claim 3, further comprising at least one of a second filler, a flame retardant, a dispersing agent, and a toughener, wherein the second filler is not a flat glass fiber.

9. The fluororesin composition of claim 4, further comprising at least one of a second filler, a flame retardant, a dispersing agent, and a toughener, wherein the second filler is not a flat glass fiber.

10. The fluororesin composition of claim 5, further comprising at least one of a second filler, a flame retardant, a dispersing agent, and a toughener, wherein the second filler is not a flat glass fiber.

11. A resin sheet, which is prepared by impregnating a reinforcing material with the fluororesin composition of claim 1 or by coating the fluororesin composition of claim 1 onto a reinforcing material and drying the impregnated or coated reinforcing material.

12. The resin sheet of claim 11, wherein the reinforcing material is a woven glass fiber cloth or a nonwoven glass fiber cloth.

13. The resin sheet of claim 12, wherein the woven glass fiber cloth and the nonwoven glass fiber cloth are independently prepared from a glass fiber selected from the group consisting of E-glass fiber, NE-glass fiber, Q-glass fiber, D-glass fiber, S-glass fiber, T-glass fiber, L-glass fiber, and combinations thereof.

14. A resin sheet, which is prepared by drying the fluororesin composition of claim 1 into a sheet.

15. A metal-clad laminate, which is prepared by laminating the resin sheet of claim 11 and a metal foil.

16. A metal-clad laminate, which is prepared by laminating the resin sheet of claim 14 and a metal foil.

17. A printed circuit board, which is prepared from the metal-clad laminate of claim 15.

18. A printed circuit board, which is prepared from the metal-clad laminate of claim 16.

* * * * *